(12) United States Patent
Crozier et al.

(10) Patent No.: US 6,857,087 B2
(45) Date of Patent: Feb. 15, 2005

(54) HIGH-PERFORMANCE LOW-MEMORY INTERLEAVER BANKS FOR TURBO-CODES

(75) Inventors: Stewart N. Crozier, Groton, MA (US); Paul Guinand, Fitzroy Harbour (CA)

(73) Assignee: Her Majesty the Queen in right of Canada, as represented by the Secretary of State for Industry through the Communication Research Centre (CA)

( * ) Notice: Subject to any disclaimer, the term of this patent is extended or adjusted under 35 U.S.C. 154(b) by 438 days.

(21) Appl. No.: 10/165,122

(22) Filed: Jun. 7, 2002

(65) Prior Publication Data

US 2003/0033565 A1 Feb. 13, 2003

Related U.S. Application Data

(60) Provisional application No. 60/297,364, filed on Jun. 11, 2001.

(51) Int. Cl.[7] .................... G06F 29/00; H03M 13/00
(52) U.S. Cl. ...................... 714/702; 714/756
(58) Field of Search ............... 714/701, 702, 714/756, 755, 754, 752, 746, 763, 784, 786, 791, 792, 794; 708/813, 530, 534, 5

(56) References Cited

U.S. PATENT DOCUMENTS

| 6,339,834 B1 | * | 1/2002 | Crozier et al. | 714/701 |
|---|---|---|---|---|
| 6,637,000 B2 | * | 10/2003 | Rowitch et al. | 714/755 |
| 6,744,744 B1 | * | 6/2004 | Tong et al. | 370/320 |
| 2002/0087923 A1 | * | 7/2002 | Eroz et al. | 714/702 |

* cited by examiner

*Primary Examiner*—Christine T. Tu
(74) *Attorney, Agent, or Firm*—Andrus, Sceales, Starke & Sawall, LLP

(57) ABSTRACT

An interleaver for interleaving a set of K ordered elements is disclosed herein. The disclosed interleaver can be expressed as a single permutation that corresponds to two local dithering operations and a global permutation operation. The single permutation can be represented as a small collection of short vectors, and can be calculated recursively, allowing the interleaver to be both stored and implemented using a smaller amount of memory than conventionally possible.

32 Claims, 5 Drawing Sheets

HIGH-PERFORMANCE LOW-MEMORY INTERLEAVER BANKS FOR TURBO-CODES

CROSS REFERENCE TO RELATED APPLICATION

The present application is based on and claims priority to U.S. Provisional Application Ser. No. 60/297,364 filed Jun. 11, 2001.

FIELD OF THE INVENTION

The present invention relates to interleavers in communication systems. In particular, the present invention relates to a high performance low memory interleaver bank for Turbo-code encoders and decoders, such as those designed using a more natural and intuitive definition of spread between interleaving indices.

BACKGROUND OF THE INVENTION

Turbo-codes have received considerable attention since their introduction in 1993. This is due to their powerful error correcting capability, reasonable complexity, and flexibility in terms of accommodating different block lengths and code rates.

Interleaving is a key component of Turbo-codes. FIG. 1 illustrates a conventional Turbo-code encoder with two rate ½ encoders. A source (not shown) provides symbols $d_i$ to a first recursive systematic convolutional (RSC) encoder 100, and to an interleaver 102, which interleaves the symbols and provides the interleaved copy to the second RSC encoder 104. The output from encoders 100 and 104 is provided to a puncturer 106 which punctures the parity symbols generated by the RSC encoders. The puncturer 106 may optionally puncture some of the source data symbols. The source symbols $d_i$ and corresponding punctured parity symbols $p_i$ are both provided, as the encoded codeword, to the modulator which is not shown.

Two interleaver types that have been commonly investigated are the "random" interleaver and the so-called "S-random" or "spread" interleaver. It is known in the art that good spreading properties are desirable for both fast convergence during iterative decoding and maintenance of good distance properties between codewords. More recent high-spread interleavers include dithered golden interleavers, and low extrinsic correlation interleavers. Methods of generating high-spread random (HSR) interleavers are known. In a paper entitled "New High-Spread High-Distance Interleavers for Turbo-codes" presented at $20^{th}$ Biennial Symposium on Communications, Kingston Ontario, Canada by S. Crozier, pp. 3–7, May 28–31 2000, a method of developing high spread interleavers was disclosed. This method also uses a more natural and effective definition of spread that is closely related to the distance properties of Turbo-codes. The same spread definition is used here. The HSR method, along with distance spectrum testing and index shuffling to eliminate low-weight codewords (post-processing), has provided some of the best performance results to date. The HSR method is used herein as one performance benchmark and is fully described in Canadian Patent Application No. 2,348,941 to Crozier.

The above described interleaver design methods typically require that all $K_b$ indices be stored to implement a single interleaver of length $K_b$. This is not a major concern when only one interleaver is required, as the other memory requirements for the corresponding Turbo-code encoder and decoder are also of order $K_b$. However, when a bank of B interleavers is required to accommodate B different block lengths, and B is on the order of the longest interleaver length, $K_B$, then the interleaver bank memory requirements become order $K_B^2$. This can be prohibitive, especially if $K_B$ is many thousands of bits. This is referred to as the interleaver bank problem.

In general, there are several criteria that a good interleaver bank should satisfy. The bank should provide a wide range of interleaver lengths, for example from a few tens of bits to many thousands of bits, depending on the application. The bank should have good resolution with convenient interleaver lengths. For example, the lengths could increase by 1 or 2 bits for short lengths (tens of bits), by a single byte (8 bits) for medium lengths (hundreds of bits), or by a few bytes for long lengths (thousands of bits). The amount of memory required to define and store each interleaver should be low. Ideally, there should only be a few parameters per interleaver length. The algorithm used to generate the interleaver indexes should also be simple. If the algorithm is simple enough, the indexes for a selected interleaver can be generated "on-the-fly", as needed by the encoder and decoder, saving even more memory than if they had to be statically stored. On-the-fly index generation is considered a bonus feature since the overall memory requirements remain order $K_B$, with or without this feature. However, this feature still reduces the amount of memory required and simplifies the initialization process when changing block lengths. Finally, the interleaver bank should provide good error rate performance for all block lengths.

There are well understood techniques used to design highly structured interleaver banks that satisfy all but the last of the above criteria. The challenge is to develop a design technique that yields good performance. For example, given a block length, K, a simple relative prime (RP) interleaver can be defined by just one other parameter, p, the modulo-K index increment. These interleavers can easily achieve high spreads and thus can eliminate the worst-case low-weight codewords. In fact, these interleavers do provide excellent performance for short block lengths. However, the performance for medium and long block lengths is poor because of the large number of compound low-weight codewords generated by the repetitive structure. Another example of a low-memory interleaver bank is that specified in the Third Generation Project Partnership (3GPP) standard. The 3GPP standard is used herein as one performance benchmark. Dithered-diagonal interleavers are also candidates for benchmarks. In particular, excellent performance results have been obtained for the special block lengths of $K=2n^2$, where n is an integer, but not a multiple of the period of the feedback polynomial in the RSC encoders (e.g. 7 for 8-state RSC encoders). These special interleavers can be stored and implemented using just n index increment values. This represents a significant reduction in the memory requirements. However, the bank resolution is rather coarse and the block lengths are not the most convenient (e.g. they are generally not integer multiples of bytes).

Interleavers can be defined and implemented in a number of different ways. FIG. 2 shows the definition used here. The interleaver reads from a vector of input symbols or samples, $v_{in}$ 108, and writes to a vector of interleaved or permuted output samples, $v_{out}$ 110. The output samples 110 are written using the write indexes i=0 . . . K−1, where K is the interleaver length. Vector I defines the order that the samples are read from the input vector. That is, the i-th output, written to location i in the output vector, is read from location I(i) in the input vector. The interleaver is completely defined by read vector I. The elements being interleaved can be symbols used in an encoder, such as standard bits, or they can be signal samples or soft reliability values corresponding to transmitted symbols in a decoder. To be general, the symbols or samples will simply be referred to as elements. It is understood that interleavers are required in both encoders and decoders and that the term interleaver is also used to refer to a deinterleaver.

For example, letting $[x]_m$ denote x modulo-m arithmetic, a simple RP interleaver of length K is defined by $$I(i)=[s+ip]_K, i=0 \ldots K-1 \quad (1)$$

where p and K are relative primes and s is the starting index. Note that I can also be computed recursively using $$I(i)=[I(i-1)+p]_K, i=1 \ldots K-1 \quad (2)$$

where I(0)=s. Thus, an RP interleaver can be implemented using a single modulo-K index increment, p.

The aforementioned new spread measure associated with two write indexes i and j, for any interleaver I, is defined as $$S''_{new}(i, j)=|I(i)-I(j)|+|i-j| \quad (3)$$

The (minimum) spread associated with index i is then $$S'_{new}(i) = \min_{j, j \neq i}[S''_{new}(i, j)] \quad (4)$$

The overall (minimum) spread is defined as $$S_{new} = \min_i [S'_{new}(i)] \quad (5)$$

Proper termination of the Turbo-code's RSC constituent codes is very important for good performance at low error rates. Some form of dual termination or dual tail-biting is recommended for performance reasons. With dual tail-biting, the absolute differences in (3) should be computed in a tail-biting sense, as will be readily understood by one of skill in the art. For these spread definitions, it can be shown that the theoretical maximum spread (with dual tail-biting) is floor($\sqrt{2K}$). As an example, for a block length of K=512, the theoretical maximum spread is 32 (i.e. $S_{new} \leq 32$).

It is, therefore, desirable to provide a method of designing an interleaver that provides adequate packet error rate (PER) performance, good spread, and requires very little memory to store. Additional benefits of system granularity and the ability to generate the interleavers on-the-fly would also be advantageous to provide.

SUMMARY OF THE INVENTION

It is an object of the present invention to obviate or mitigate at least one disadvantage of previous interleavers and interleaving methods. It is a further object of the present invention to provide an interleaver suitable for conserving memory in an interleaver bank.

In a first aspect of the present invention there is provided a method of interleaving a set of K ordered elements which can be organised into m subsets, the subsets having R elements on average. The method comprises the steps of permuting the elements within each of the m subsets to produce a dithered set, then permuting the dithered set to produce a permuted set that can be organised as n subsets, the subsets having W elements on average, and then permuting the elements within each of the n subsets to produce an interleaved set of K ordered elements. In various embodiments of the first aspect all the m subsets have R elements, all the n subsets have W elements and each of the m and n subsets are distinct. In a further embodiment each of the m sets is permuted in an identical fashion, the step of permuting the dithered set produces a relative prime interleaving of the K elements and each of the n sets is permuted in an identical fashion.

In a second aspect of the present invention there is provided a method of designing an interleaving method, for interleaving a set of K ordered elements, where the K elements can be organised into m subsets having an average size of R elements. The method of designing comprises selecting a permutation of the elements in each of the m subsets for dithering the set of K ordered elements, selecting a permutation of the dithered set for permuting the set of K ordered elements where the permuted set can be organised as n subsets having an average of W elements each, selecting a permutation of the elements in each of the n subsets for dithering the set of K ordered elements and combining the three permutations to create an interleaving method. In embodiments of the present aspect of the invention each of the m subsets has R elements, each of the n subsets has W elements and each of the m and n subsets are distinct. In further embodiments of the present aspect the selected permutations of the m subsets are identical, the selected permutation of the K elements results in a relative prime interleaving of the dithered set of K ordered elements and the selected permutations of the n subsets are identical. In a further embodiment of the present invention the step of combining includes the step of determining a global permutation equivalent to the combination of the previous three permutations, where the global permutation can be a recursive function based on M ordered index increments, where M is the lowest common multiple of R and W, and preferably where M, R, and W are identical.

In a third aspect of the present invention there is provided an interleaver, having a memory for storing K ordered elements that can be organised into m subsets that have an average length of R elements. The interleaver comprises a first ditherer connected to the memory, a permuter connected to the first ditherer, and a second ditherer operatively connected to the permuter. The first ditherer is for performing a local permutation of the elements in each of the m subsets to produce a dithered set of K ordered elements. The permuter, for performing a global permutation of the K elements in the dithered set to produce a permuted set of K ordered elements, where the permuted set can be organised as n subsets that have an average length of W elements. The second ditherer, for performing a local permutation of the elements within each of the n subsets to produce an interleaved set of K ordered elements. In embodiments of the present invention the permuter is a relative prime interleaver for interleaving the dithered set with an interleaving index increment that is relatively prime to K, and the first ditherer, the permuter, and the second ditherer are integrated for providing the interleaved set directly from the K ordered elements based on a mapping corresponding to the combining of the first ditherer, the permuter, and the second ditherer. In an alternate embodiment of the present invention the mapping is stored as a recursive function based on M ordered index increments where M, R, and W are identical. An alternate embodiment of the present invention provides a plurality of the above described interleavers connected as a bank, each interleaver having its own first dither, permuter, and second dither specifications. In a further embodiment the interleaver bank further comprising an interleaver selector for selecting an interleaver from the plurality to interleave K ordered input elements into an interleaved set of K ordered output elements. In another embodiment the above described interleaver is connected to a recursive systematic convolutional encoder of a Turbo-code encoder, for providing the recursive systematic convolutional encoder with the interleaved set of K ordered elements.

A subsequent aspect of the present invention provides an interleaving system, for permuting a variable number of elements, using a recursively derived set of interleaver indices. The interleaver system comprises a memory, an interleaver bank memory, and an interleaver index generator which is operatively connected to the memory and the interleaver bank memory. The memory receives and stores the variable number of elements. The interleaver bank memory stores B sets of interleaver specification parameters, the B sets corresponding to B interleavers. The interleaver index generator selects one of the B sets of interleaver specification parameters from the interleaver bank memory, derives M index increments from the selected set of specification parameters, generates a set of interleaver indices from the set of M index increments, and outputs the contents of the memory in an order determined by the generated set of interleaver indices. In an embodiment of the present aspect of the invention the set of specification parameters includes a set of M index increments. In an alternate embodiment, the set of specification parameters includes a read dither vector of length R and a write dither vector of length W. In further embodiments M is a common multiple of R and W, and is preferably the lowest common multiple. In a presently preferred embodiment of the present aspect M, R and W are identical.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for a new family of interleavers, called dithered relative prime (DRP) interleavers, that provides a good solution to the interleaver bank problem for Turbo-codes.

Figure 3:
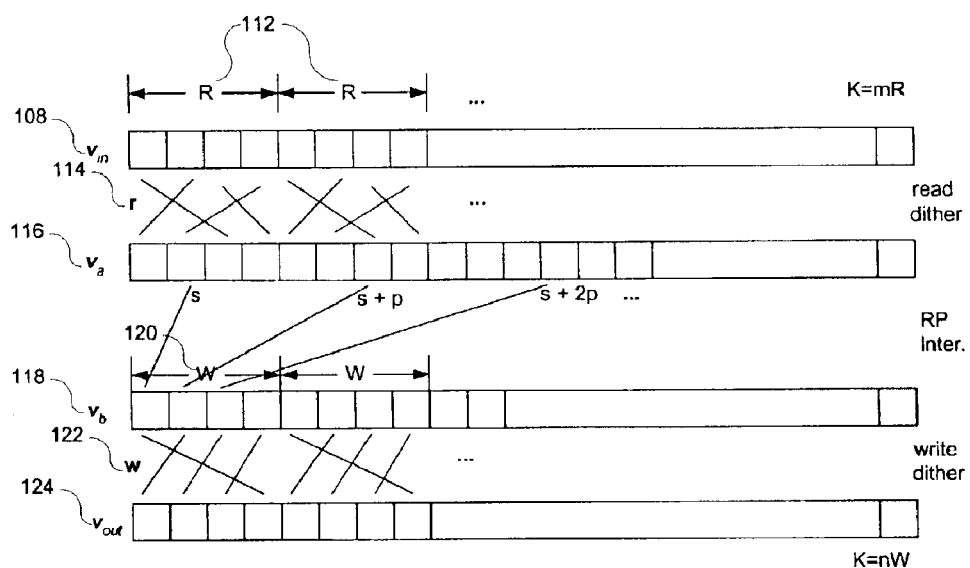
FIG. 3 is an illustration of an interleaver of the present invention.

FIG. 3 shows the approach used to design dithered relative prime (DRP) interleavers. The approach is well suited to dual tail-biting, which is the most difficult Turbo-code termination option to accommodate. The approach consists of three stages. Because interleavers have application in both the encoder and decoder of a transmission system they can operate either on source symbols or samples that correspond to encoded symbols. For the sake of clarity the description will rely upon the term element to represent both symbols and samples, though use of either of these terms should not be considered to be limiting of the scope of the invention.

Input vector $v_{in}$ 108, of length K, is divided into m segments 112, each of length R, where K=mR. Each of the R length segments 112 is dithered (permuted locally) using a small read dither vector, r 114, of length R. Vector r 114 is a permutation of indexes 0 through R−1. This creates a local dithering of all the elements in input vector $v_{in}$ 108. The resulting vector is referred to as $v_a$ 116. Vector $v_a$ 116 is permuted using an RP interleaver to obtain good spread. Finally, the resulting vector, $v_b$ 118, is divided into n segments 120 of length W, where K=nW. Each segment 120 is then dithered using a small write dither vector, w 122, of length W. This final step generates the output vector $v_{out}$ 124. Vector w 122 is a permutation of indexes 0 through W−1. The interleaver length, K, must be a multiple of both R and W. Note that short read and write dither vectors will not destroy the good spreading properties of an RP interleaver, but tend to lower the spread somewhat. As illustrated in FIG. 3, the presently preferred embodiment divides input vector $v_{in}$ 108 into m segments of length R. It is conceivable that m segments with an average length of R could be used. Similarly n segments with an average length of W could be used. In the presently preferred embodiment, the local dithering in each of the m segments is identical, though it is conceivable that different dither patterns could be employed for each of the segments. The same idea of different dither patterns can also be employed in the write dither phase. Different segment sizes and dither patterns in the read and write dither steps is within the scope of the present invention, though they may adversely affect the resulting structure and spread.

Figure 1:
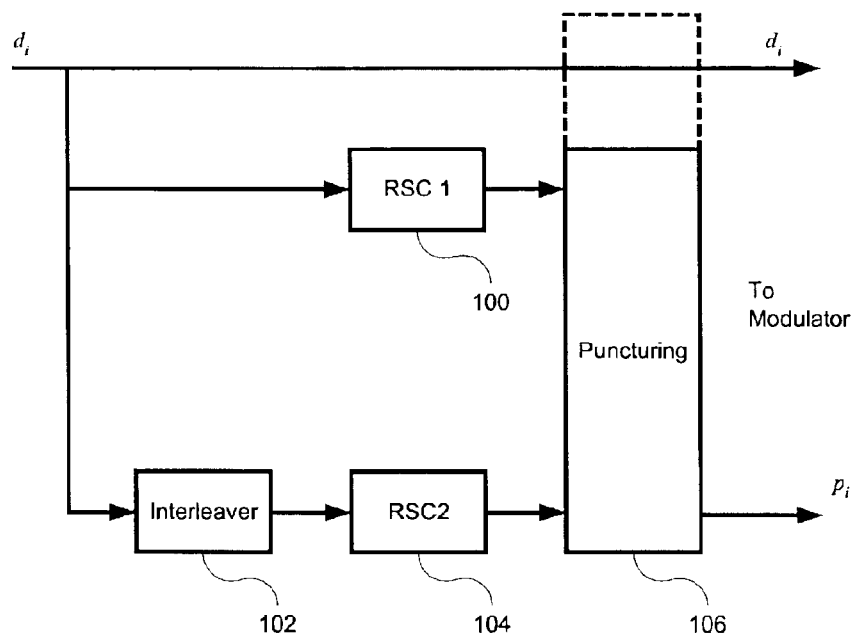
FIG. 1: illustrates a prior art Turbo-code encoder with two rate ½ recursive systematic convolutional encoders.
Figure 2:
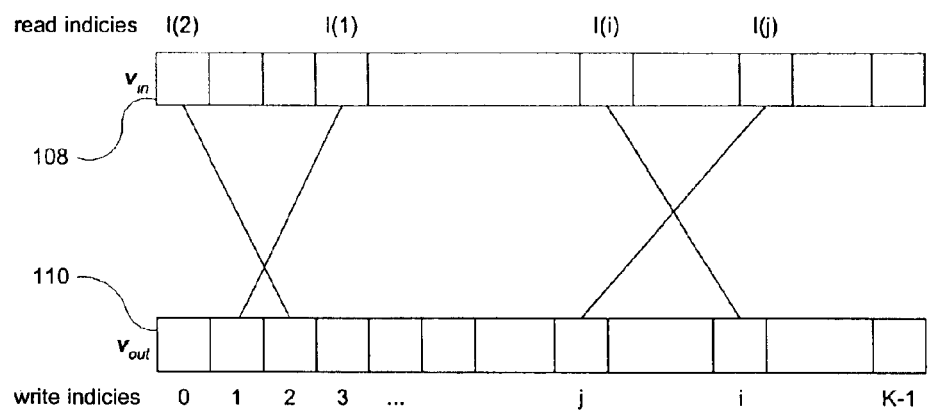
FIG. 2 is a prior art interleaver.

A DRP interleaver can be implemented using the 3 stage process as described above. However, it is also possible to represent the operation as an equivalent overall interleaver vector, I, of the sort that could be implemented by the interleaver of FIG. 2. The method of determining the overall interleaver vector I is provided below.

Let $\lfloor x \rfloor$ denote the floor(x) function and again let $[x]_m$ denote x modulo-m arithmetic. With these definitions, the equations for the various DRP interleaver vectors shown in FIG. 3 can be expressed as follows:

$$v_a(i)=v_{in}(I_a(i)),\ v_b(i)=v_a(I_b(i)),\ v_{out}(i)=v_b(I_c(i)),\ i=0\ldots K-1 \quad (6)$$

where $$I_a(i)=R\lfloor i/R\rfloor+r([i]_R),\ i=0\ldots K-1 \quad (7)$$

$$I_b(i)=[s+ip]_K,\ i=0\ldots K-1 \quad (8)$$

$$I_c(i)=W\lfloor i/W\rfloor+w([i]_W),\ i=0\ldots K-1 \quad (9)$$

Thus, the input vector can be interleaved using $$v_{out}(i)=v_{in}(I(i)),\ i=0\ldots K-1 \quad (10)$$

where the interleaver is completely defined by $$I(i)=I_a(I_b(I_c(i))),\ i=0\ldots K-1 \quad (11)$$

All the indexes of I can be computed using equations (7), (8), (9), and (11).

It is clear that a DRP interleaver can be stored by just storing r, w, s and p. This represents a significant reduction in storage, in comparison to storing all K indexes, but further simplifications and reductions are possible.

Let M be the least common multiple (LCM) of R and W. It can be shown that $$I([i+M]_K)=[I(i)+Mp]_K,\ i=0\ldots K-1 \quad (12)$$

It follows that the interleaver indexes can be computed recursively by cycling through M index increments. That is, $$I(i)=[I(i-1)+P([i]_M)]_K,\ i=1\ldots K-1 \quad (13)$$

where I(0) and the M index increments in vector P are defined by (11) and $$P(i)=[I(i)-I(i-1)]_K,\ i=0\ldots M-1 \quad (14)$$

Thus, all the indexes of I can be computed using the simple recursion in (13), and the interleaver can be stored by just storing P. I(0) is typically an arbitrarily assigned value.

Further, equation (13) is simple enough to accommodate "on-the-fly" index generation, saving even more memory for both software and hardware implementations of the interleaver. In particular, this method works well with the circular buffer feature provided by most modern digital signal processors.

A few important properties are now explained further. Dual tail-biting is assumed for convenience. A rotational (modulo-K) shift in $v_{in}$ or $v_{out}$ does not affect the spread or distance properties of the Turbo-code. However, a rotational shift in $v_a$ or $v_b$ can affect both the spread and distance properties. It can be shown that any shift in $v_a$ or $v_b$ is equivalent to shifting $v_{in}$ and/or $v_{out}$ and using a different value for s in the RP interleaver. Thus, the s parameter is sufficient for testing different shifts when searching for good interleavers. Consider the special case where R and W are relative primes. In this case we have M=R×W. Thus, a small amount of dither (small values for R and W) can still force a large number of index increments, M. This is undesirable since M is also the resolution of the interleaver bank (i.e. K must be a multiple of M). There is also no benefit derived from trying different s values since all relative shifts between dither vectors r and w will occur for every value of s. At the other extreme we have the special case where M=R=W. This case offers the largest amount of dither for the smallest number of index increments, M, and the finest interleaver bank resolution. In this case, different results can be achieved for all shifts s=0 . . . M−1, and thus all of the different shift values are worth considering. This second case is more convenient and has generally been found to give better distance results. As an example, with M=R=W= 8, only 8 index increments are required to both store and implement each interleaver, and the interleaver bank resolution is conveniently measured in bytes. The case where M=R=W is a presently preferred embodiment. Though examples presented below are directed to this specific embodiment, one of skill in the art will readily appreciate that they are applicable to other embodiments of the present invention as well.

It will be apparent to one of skill in the art that a DRP interleaver is suitable for use in an interleaver bank where an interleaver selector selects an interleaver from the plurality of interleavers in the bank to interleave the K input elements. In a bank configuration, each interleaver will have its own first dither, permuter and second dither specifications. These specifications will determine how the ditherers and the permuter reorder the elements.

Figure 4:
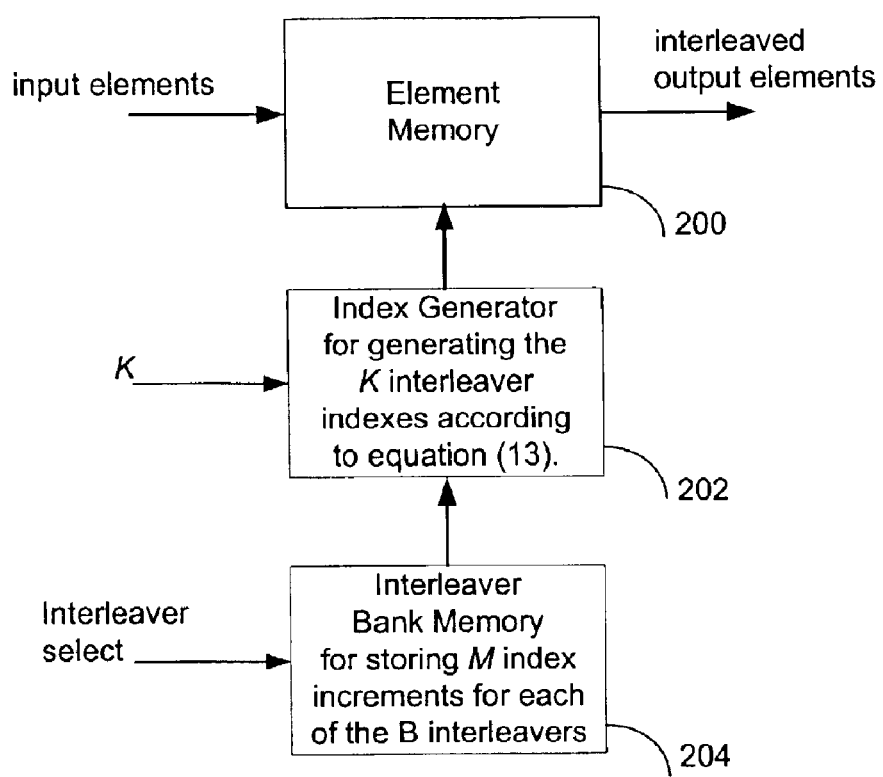
FIG. 4 illustrates a dynamic bank interleaver of the present invention.

FIG. 4 shows an interleaving system for storing a bank of B interleavers and implementing a selected interleaver, according to equation (13). The interleaving system has an interleaver bank memory 204 for storing M index increments for each of the B interleavers in the bank, an element memory 200 for storing and buffering the K input elements to be interleaved, and an index generator 202 for generating the interleaver indexes used to read out the elements from the element memory. For a selected interleaver, the index generator 202 reads the M index increments, P(i), i=0 . . . M−1, sequentially and repeatedly from the bank memory 204 and generates the K interleaver indexes on-the-fly, according to equation (13). A significant amount of memory is saved because M is typically much smaller than the interleaver length, K, for each interleaver in the bank. Clearly this interleaving system provides memory advantages by storing only a set of M index increments for each interleaver in the bank, and then provides further memory advantages by employing on-the-fly calculation of interleaver indices for a selected interleaver. This system provides B different interleavers in a much smaller amount of memory than would typically be required in an interleaver bank. With this dynamically calculated interleaver bank, the elements are stored in a memory and are then read out of the memory in the order determined by the calculated interleaver indices. This removes the need for a distinct permuter, though it is conceivable that a permuter could be used to reorder the elements in the memory prior to their being read out.

The lowest weight Turbo-code codewords are constructed from combinations of low input-weight (IW) patterns that lead to low-weight RSC codewords in both RSC constituent codes. It is important to determine which combinations of low IW patterns need to be considered. For example, certain combinations do not need to be considered because of high spread. A number of distance lower bounds have been derived. The derivation of these bounds will be understood by one of skill in the art, and is not presented herein. From the derived bounds it was concluded that the most important cases to test, and improve, are: "IW2:2,2", "IW3:3,3", "IW4:22,22", "IW6:33,222", "IW6:222,33", and "IW6:222, 222". The meaning of these case labels is as follows. Each case label contains 3 numbers. The first number is the total IW. The second and third numbers indicate the base pattern combinations before and after interleaving, where each digit is the IW of a self-terminating base pattern. By definition, all base patterns correspond to valid RSC codewords and a base pattern cannot be decomposed into a number of smaller base patterns.

Distance measurement routines have been developed for all of these cases. For completeness routines were also developed to handle the other IW4 cases, namely "IW4:4,4", "IW4:4,22", and "IW4:22,4". With these extra IW4 cases included, the minimum measured distances are guaranteed to be the true minimum distances for all possible IW2, IW3, and IW4 cases. While the minimum distances for IW5 and IW6 cannot be guaranteed in general, the minimum measured distance for IW6 is believed to be the true minimum distance (over IW5 and IW6) for long blocks with large spread. This is because all the IW5 cases and all the other IW6 cases improve as the spread increases, as one of skill in the art will readily appreciate.

In a presently preferred embodiment, the Turbo-code encoder consists of two 8-state, rate ½ RSC encoders operating in parallel with the data bits interleaved between the two RSC encoders. The (feedback, feedforward) polynomials are (13,15) octal, as specified by the 3GPP standard. Without puncturing, the overall code rate is ⅓. Table 1, below, shows example unpunctured (rate ⅓) distance results obtained for different block lengths, K, and number of index increments, M=R=W. The measured distances, D(IW), are a function of IW. Results are shown for IW values 2, 3, 4, and 6. The spread, $S_{new}$, is also shown. As an example, consider the distance results with K=512. The M=8 interleaver is expected to perform the best for a code rate of ⅓, but the M=4 interleaver should also perform well when puncturing is used to achieve higher code rates. This is because the lower IW cases are more critical with puncturing.

TABLE 1

Example unpunctured (rate ⅓) distances for 8-state constituent codes, different block lengths, K, and number of index increments, M.

| K | M | $S_{new}$ | D(2) | D(3) | D(4) | D(6) | min(D) |
|---|---|---|---|---|---|---|---|
| 512 | 1 | 32 | 134 | 65 | 28 | 30 | 28 |
| 512 | 2 | 32 | 134 | 61 | 36 | 38 | 36 |
| 512 | 4 | 29 | 66 | 65 | 52 | 38 | 38 |
| 512 | 8 | 24 | 58 | 57 | 44 | 46 | 44 |
| 1024 | 8 | 31 | 86 | 61 | 56 | 50 | 50 |
| 2048 | 8 | 57 | 90 | 93 | 60 | 54 | 54 |

TABLE 1-continued

Example unpunctured (rate ⅓) distances
for 8-state constituent codes, different
block lengths, K, and number of index increments, M.

| K | M | $S_{new}$ | D(2) | D(3) | D(4) | D(6) | min(D) |
|---|---|---|---|---|---|---|---|
| 4096 | 16 | 62 | 110 | 97 | 60 | 54 | 54 |
| 8192 | 16 | 107 | >150 | >100 | 72 | 58 | 58 |

Simulation results are presented for binary antipodal signalling (e.g. BPSK or QPSK modulation) and a block length of K=512. Dual termination was used. The Turbo-code used 8-state constituent codes, and the decoder used an enhanced maximum-log-a-posteriori-probability (max-log-APP) approach, with scaled extrinsic information. It has been found that this decoding approach typically provides performance within 0.1 dB of true log-APP processing for 8-state codes. The maximum number of decoding iterations was set to 16. Early stopping was also used where the decisions before and after each half-iteration must agree 3 times in a row before stopping.

Figure 5:
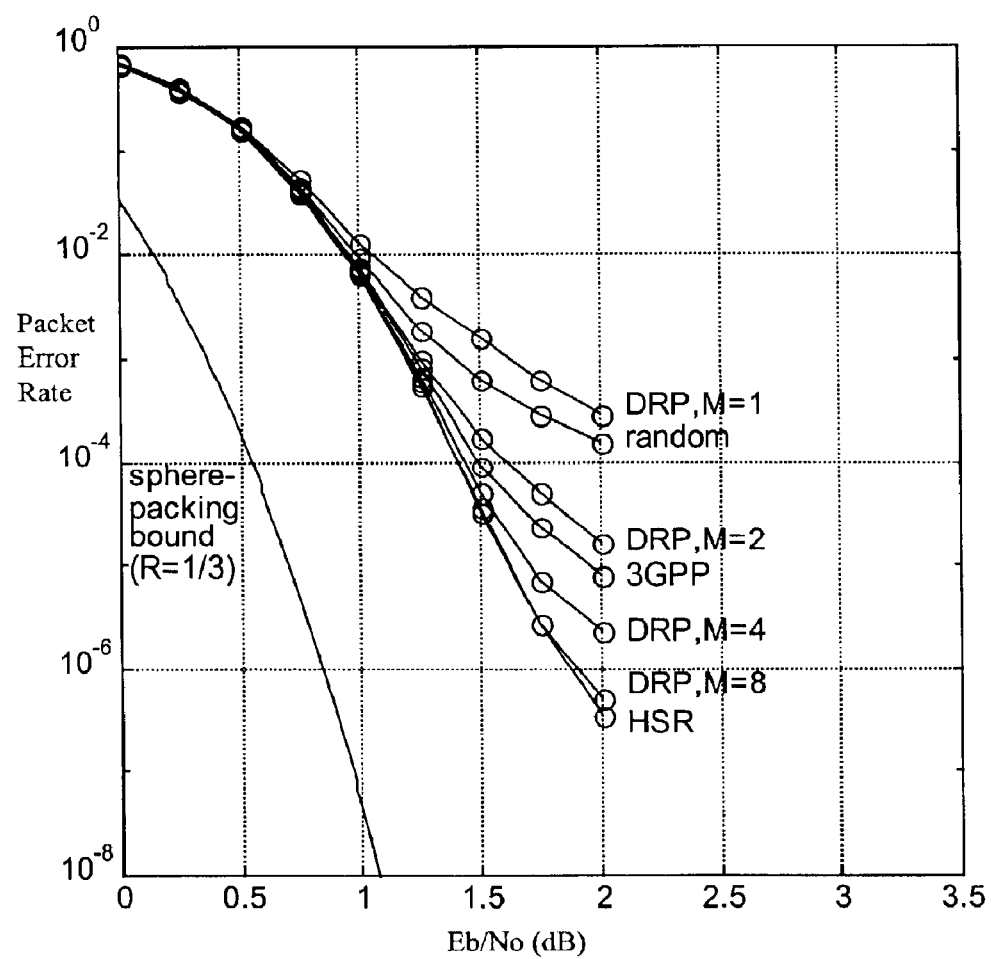
FIG. 5 illustrates PER results for K=512 and a code rate of ⅓.

FIG. 5 shows the packet error rate (PER) results for a block length of K=512 and a code rate of ⅓. (The nominal code rate is used for convenience, the exact code rate is slightly less due to the 6 termination bits included in the interleaver length, K.) Results are shown for the 4 DRP interleavers indicated in Table 1, with K=512 and M=1, 2, 4, and 8. For comparison, results are also shown for a random interleaver, the 3GPP interleaver, and an HSR interleaver with post-processing to improve the distance spectrum. As expected, the random interleaver performs poorly, the 3GPP interleaver performs better, and the HSR interleaver provides the best benchmark performance. One of skill in the art will not be surprised that the DRP interleaver with M=1 (actually a simple RP interleaver) performs worse than the random interleaver (although it is expected to cross over at higher SNRs). There is a significant improvement with M=2, but performance is still worse than that of the 3GPP interleaver. Performance continues to improve with M=4 and M=8. Note that the performance with M=8 is essentially the same as that for the HSR interleaver. FIG. 4 also shows Shannon's continuous-input sphere-packing bound for a rate ⅓ code. Note that the HSR and DRP (M=8) interleavers both provide performance within 1 dB of this bound down to a PER of about $10^{-6}$. Storing this HSR interleaver requires storing all K=512 interleaver indexes, but storing the DRP (M=8) interleaver requires storing only M=8 index increments.

Figure 6:
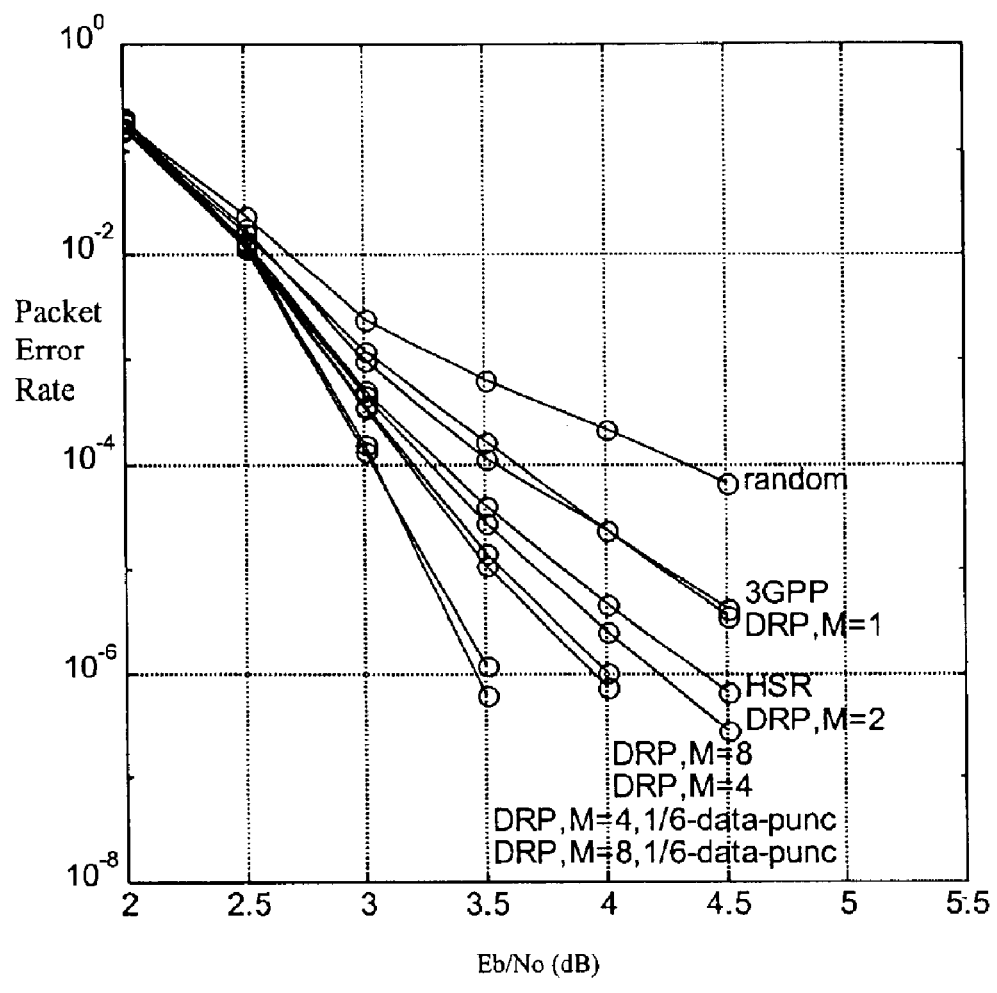
FIG. 6 illustrates PER results for K=512 and a code rate of ⅔.

FIG. 6 shows the PER results for the same interleavers but with a code rate of ⅔. Most of the results were obtained without any data puncturing using the puncture masks (data, par1, par2)=(1, 0100, 0010), where a "0" indicates a punctured bit. The DRP (M=1) interleaver is as good as the 3GPP interleaver. The DRP (M=2) interleaver is better than the HSR interleaver, and performance continues to improve with M=4. Note that the M=4 result is slightly better than the M=8 result. This is not surprising given the unpunctured distance results shown in Table 1. The low IW cases (IW2, IW3, and IW4) are clearly dominating the performance.

A small amount of data puncturing, in exchange for more parity bits, can significantly improve the flare performance. This works because most of the distance, especially for the low IW cases, tends to come from the parity bits. It follows that the better the interleaver the better data puncturing works. There is a practical trade-off, however, as too much data puncturing can significantly degrade the convergence performance up top. FIG. 6 shows results with ⅙ data puncturing for the two DRP interleavers with M=4 and M=8. The puncture masks were (data, par1, par2)=(111110, 001, 001). As can be seen, the flare performance is improved with only a small degradation up top. Note that the M=8 result is now slightly better than the M=4 result, reversing the trend without data puncturing. This is expected because a decrease in the amount of parity puncturing tends to shift the emphasis away from the lowest IW cases. Even so, there is very little to choose from between these two DRP interleavers.

In summary, DRP interleavers provide a solution to the interleaver bank problem for Turbo-codes. The design is based on using a small read dither vector, r, of length R, a high-spread RP interleaver with starting index s and index increment p, and a small write dither vector, w, of length W. Distance testing is used to help select the dither parameters. A DRP interleaver can be stored by just storing r, w, s and p.

A DRP interleaver can also be stored using a vector, P, containing M index increments, where M is the least common multiple of R and W. The interleaver is generated by repeatedly cycling through these M index increments. This method is simple enough to accommodate "on-the-fly" index generation, and works well with the circular buffer feature provided by most modern digital signal processors. The special case of M=R=W offers the largest amount of dither for the smallest number of index increments. This is important because M is also the resolution of the interleaver bank. As an example, with M=8, only 8 index increments are required to both store and implement each interleaver, and the interleaver bank resolution is conveniently in bytes.

The memory can be reduced further by selecting a small number of "good" dither combinations (r, w, and s) and then just optimizing over p for each interleaver length. Good distance results have been obtained with as few as 8 dither combinations. With this approach, each interleaver in the bank can be stored by just storing 2 integers, the number of the best dither combination and the corresponding best p value found. In this case, the memory that is required to store a large bank of B interleavers is only about 2B integers.

In a presently preferred embodiment the Turbo-code encoder consists of two 8-state, rate ½ recursive systematic convolutional (RSC) encoders operating in parallel with the data bits interleaved between the two RSC encoders. The (feedback, feedforward) polynomials are (13,15) octal, as specified by the 3GPP standard. RSC codes with 4 and 16 states have also been observed to work well with DRP interleavers. Without puncturing, the overall code rate is ⅓. Other code rates are obtained by puncturing the coded bits, or by using constituent codes with different code rates. Standard practice has been to only puncture the parity bits. A significant increase in (Hamming) distance is achieved by puncturing a small number of data bits. A high minimum distance is desirable for both lowering the so-called "error floor" or flare and for making the asymptotic flare performance as steep as possible.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of interleaving a set of K ordered elements, the K ordered elements organisable as m subsets, the subsets having an average size of R elements, the method comprising:

permuting the elements within each of the m subsets to produce a dithered set of K ordered elements;

permuting the K elements in the dithered set of ordered elements to produce a permuted set of K ordered elements, the permuted set organisable as n subsets having an average size of W elements; and permuting the elements within each of the n subsets to produce an interleaved set of K ordered elements.

2. The method of claim 1, wherein each of the m subsets has R elements.

3. The method of claim 1, wherein each of the n subsets has W elements.

4. The method of claim 1, wherein each of the m subsets are distinct and each of the n subsets are distinct.

5. The method of claim 1, wherein each of the m subsets is permuted in an identical fashion.

6. The method of claim 1, wherein the step of permuting the K elements in the dithered set produces a relative prime interleaving of the K elements.

7. The method of claim 1, wherein each of the n subsets is permuted in an identical fashion.

8. A method of designing an interleaving method, for interleaving a set of K ordered elements, the K ordered elements organisable as m subsets having an average size of R elements, the method of designing comprising:

selecting a permutation of the elements in each of the m subsets for dithering the set of K ordered elements;

selecting a permutation of the K elements in the dithered set for permuting the set of K dithered elements, the permuted set organisable as n subsets having an average size of W elements;

selecting a permutation of the elements in each of the n subsets for dithering the set of K permuted elements; and combining the three permutation operations to create an interleaving method.

9. The method of claim 8, wherein each of the m subsets has R elements.

10. The method of claim 8, wherein each of the n subsets has W elements.

11. The method of claim 8, wherein each of the m subsets are distinct and each of the n subsets are distinct.

12. The method of claim 8, wherein the selected permutations of the m subsets are identical.

13. The method of claim 8, wherein the selected permutation of the K dithered elements results in a relative prime interleaving of the dithered set of K ordered elements.

14. The method of claim 8, wherein the selected permutations of the n subsets are identical.

15. The method of claim 8, wherein the step of combining includes the step of determining a global permutation equivalent to the combination of the three permutation operations.

16. The method of claim 15, wherein the global permutation is a recursive function based on M ordered index increments.

17. The method of claim 16, wherein M is the lowest common multiple of R and W.

18. The method of claim 16, (or 16) wherein M, R, and W are identical.

19. An interleaver, having a memory for storing K ordered elements, the ordered elements organisable into m subsets having an average length of R elements, the interleaver comprising:

a first ditherer, operatively connected to the memory, for performing a local permutation of the elements in each of the m subsets to produce a dithered set of K ordered elements;

a permuter, operatively connected to the first ditherer, for performing a global permutation of the K elements in the dithered set to produce a permuted set of K ordered elements, the permuted set organisable as n subsets having an average length of W elements; and a second ditherer, operatively connected to the permuter, for performing a local permutation of the elements within each of the n subsets to produce an interleaved set of K ordered elements.

20. The interleaver of claim 19, wherein the permuter is a relative prime interleaver for interleaving the dithered set with an interleaving index increment that is relatively prime to K.

21. The interleaver of claim 19, wherein the first ditherer, the permuter, and the second ditherer are integrated for providing the interleaved set directly from the K ordered elements based on a mapping corresponding to the combining of the first ditherer, the permuter, and the second ditherer.

22. The interleaver of claim 21, wherein the mapping is stored as a recursive function based on M ordered index increments.

23. The interleaver of claim 22, wherein M, R, and W are identical.

24. A plurality of the interleavers of claim 19, connected as a bank, each interleaver having its own first dither, permuter, and second dither specifications.

25. The interleaver bank of claim 24, further comprising an interleaver selector for selecting an interleaver from the plurality to interleave K ordered input elements into an interleaved set of K ordered output elements.

26. The interleaver of claim 19, wherein the interleaver is connected to a recursive systematic convolutional encoder of a Turbo-code encoder, for providing the recursive systematic convolutional encoder with the interleaved set of K ordered elements.

27. An interleaving system, for permuting a variable number of elements, using a recursively derived set of interleaver indices, the interleaving system comprising:

a memory for receiving and storing the variable number of elements;

an interleaver bank memory, for storing B sets of interleaver specification parameters, the B sets corresponding to B interleavers; and an interleaver index generator operatively connected to the memory and to the interleaver bank memory, for selecting one of the B sets of interleaver specification parameters from the interleaver bank memory, deriving M index increments from the selected set of specification parameters, for generating a set of interleaver indices from the set of M index increments, and for outputting the contents of the memory in an order determined by the generated set of interleaver indices.

28. The interleaving system of claim 27, where the set of specification parameters includes a set of M index increments.

29. The interleaving system of claim 27, where the set of specification parameters includes a read dither vector of length R and a write dither vector of length W.

30. The interleaving system of claim 29, where M is a common multiple of R and W.

31. The interleaving system of claim 29, where M is the least common multiple of R and W.

32. The interleaving system of claim 29, where M, R and W are identical.

* * * * *